(12) United States Patent
Tangring

(10) Patent No.: US 10,777,713 B2
(45) Date of Patent: Sep. 15, 2020

(54) METHOD OF PRODUCING AN OPTOELECTRONIC LIGHTING DEVICE AND OPTOELECTRONIC LIGHTING DEVICE

(71) Applicant: OSRAM OLED GmbH, Regensburg (DE)

(72) Inventor: Ivar Tangring, Regensburg (DE)

(73) Assignee: OSRAM OLED GmbH, Regensburg (DE)

(*) Notice: Subject to any disclaimer, the term of this patent is extended or adjusted under 35 U.S.C. 154(b) by 0 days.

(21) Appl. No.: 16/315,020

(22) PCT Filed: Jun. 30, 2017

(86) PCT No.: PCT/EP2017/066283
§ 371 (c)(1),
(2) Date: Jan. 3, 2019

(87) PCT Pub. No.: WO2018/007253
PCT Pub. Date: Jan. 11, 2018

(65) Prior Publication Data
US 2020/0185576 A1    Jun. 11, 2020

(30) Foreign Application Priority Data
Jul. 5, 2016 (DE) .................. 10 2016 112 275

(51) Int. Cl.
*H01L 33/50* (2010.01)
*H01L 33/60* (2010.01)

(52) U.S. Cl.
CPC ............ *H01L 33/505* (2013.01); *H01L 33/60* (2013.01); *H01L 2933/0033* (2013.01); *H01L 2933/0041* (2013.01); *H01L 2933/0058* (2013.01)

(58) Field of Classification Search
CPC ..... H01L 33/486; H01L 33/60; H01L 33/505; H01L 33/54; H01L 33/62; H01L 33/502;
(Continued)

(56) References Cited

U.S. PATENT DOCUMENTS

2012/0236582 A1* 9/2012 Waragaya ............... H01L 33/60
362/510
2013/0193469 A1* 8/2013 Baade ................ C09K 11/0883
257/98
(Continued)

FOREIGN PATENT DOCUMENTS

EP    2 479 812 A2    7/2012
EP    2 933 848 A1    10/2015

*Primary Examiner* — Joseph M Galvin, III
(74) *Attorney, Agent, or Firm* — DLA Piper LLP (US)

(57) ABSTRACT

A method of producing an optoelectronic lighting device includes forming a volume emitter such that it is at least partly transmissive to generated electromagnetic radiation, forming a concavely formed, optically transparent frame element including a curable, flowable material including phosphor particles at a side region of the volume emitter, wherein forming a conversion layer that converts the electromagnetic radiation into a second wavelength range is carried out by a sedimentation process of phosphor particles, and the conversion layer is formed within an optically transparent frame element in a manner adjoining an optically active region, forming a reflection element on the optically transparent frame element, and forming a conversion element that converts the electromagnetic radiation into a second wavelength range, wherein the conversion element is formed in a manner overlapping at least a second surface of the volume emitter and frame element.

20 Claims, 6 Drawing Sheets

(58) Field of Classification Search
CPC ....... H01L 33/504; H01L 33/52; H01L 33/58;
H01L 33/32; H01L 33/46; H01L 33/507;
H01L 27/156; H01L 33/06; H01L 33/28;
H01L 33/44; H01L 33/483; H01L 33/50;
H01L 33/508; H01L 33/56
See application file for complete search history.

(56) References Cited

U.S. PATENT DOCUMENTS

| | | | |
|---|---|---|---|
| 2014/0054621 A1 | 2/2014 | Seko | |
| 2015/0243854 A1 | 8/2015 | Inoue et al. | |
| 2015/0263243 A1* | 9/2015 | Nakagawa | H01L 33/504 |
| | | | 257/98 |
| 2016/0348876 A1* | 12/2016 | Azuma | H01L 33/60 |
| 2017/0222102 A1* | 8/2017 | Cheng | H01L 33/508 |

* cited by examiner

METHOD OF PRODUCING AN OPTOELECTRONIC LIGHTING DEVICE AND OPTOELECTRONIC LIGHTING DEVICE

TECHNICAL FIELD

This disclosure relates to a method of producing an optoelectronic lighting device and an optoelectronic lighting device.

BACKGROUND

Optoelectronic lighting devices are known which comprise a transparent, concavely curved frame element (referred to as a fillet) between a carrier substrate and a radiation-generating element to improve light-emitting properties of the optoelectronic lighting device.

There is nonetheless a need to provide an optoelectronic lighting device comprising an improved efficiency.

SUMMARY

I provide a method of producing an optoelectronic lighting device including forming a volume emitter including a first surface and a second surface located opposite the first surface, wherein an active region that generates electromagnetic radiation in a first wavelength range is formed in the volume emitter in a manner adjoining the first surface, and the volume emitter is formed such that it is at least partly transmissive to the electromagnetic radiation generated, forming a concavely formed, optically transparent frame element including a curable, flowable material including phosphor particles at a side region of the volume emitter, wherein forming a conversion layer that converts the electromagnetic radiation into a second wavelength range is carried out by a sedimentation process of the phosphor particles, and the conversion layer is formed within the optically transparent frame element in a manner adjoining the optically active region, forming a reflection element on the optically transparent frame element, and forming a conversion element that converts the electromagnetic radiation into the second wavelength range, wherein the conversion element is formed in a manner overlapping at least the second surface of the volume emitter and the frame element.

I also provide an optoelectronic light device including a volume emitter including a first surface and a second surface located opposite the first surface, wherein an active region that generates electromagnetic radiation in a first wavelength range is formed in a manner adjoining the first surface in the volume emitter, and the volume emitter is at least partly transmissive to the electromagnetic radiation generated, an optically transparent frame element arranged at a side region of the volume emitter, wherein a conversion layer that converts the electromagnetic radiation into the second wavelength range is formed in the optically transparent frame element in a manner adjoining the active region, and the conversion layer is produced by a sedimentation process of phosphor particles in a flowable, curable material of the frame element, a conversion element that converts the electromagnetic radiation into a second wavelength range, the conversion element being arranged on the second surface of the volume emitter, wherein the conversion element includes an edge region projecting beyond the second surface of the radiation-generating element and formed in a manner overlapping at least the frame element, and a reflection element arranged on the frame element.

Figure 1:
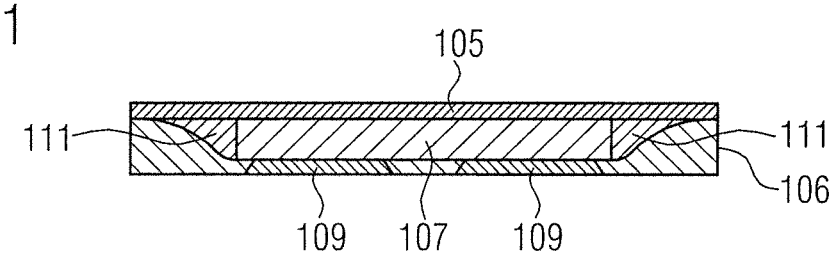
FIG. 1 shows a cross-sectional view through a conventional optoelectronic lighting device.

LIST OF REFERENCE SIGNS 100 first optoelectronic lighting device
101 transparent substrate
102 first surface of volume emitter
103 surface of transparent substrate, surface of conversion element
104 second surface of volume emitter
105 conversion element
106 reflection element
107 volume emitter
108 optically active region
109 contacting element
111 frame element
112 conversion layer
113 first temporary substrate
114 second temporary substrate
115 surface of temporary substrate
200 second optoelectronic lighting device
300 . . . 303 Method steps

DETAILED DESCRIPTION

I provide a method of producing an optoelectronic lighting device, comprising the following steps:

forming a volume emitter comprising a first surface and a second surface located opposite the first surface, wherein an active region that generates electromagnetic radiation in a first wavelength range is formed in the volume emitter in a manner adjoining the first surface, and the volume emitter is formed such that it is at least partly transmissive to the electromagnetic radiation generated, forming a concavely formed, optically transparent frame element comprising a curable, flowable material comprising phosphor particles at a side region of the volume emitter, wherein forming a conversion layer that converts the electromagnetic radiation into a second wavelength range is carried out by a sedimentation process of the phosphor particles, and the conversion layer is formed within the optically transparent frame element in a manner adjoining the optically active region, forming a reflection element on the optically transparent frame element, and forming a conversion element that converts the electromagnetic radiation into the second wavelength range, wherein the conversion element is formed in a manner overlapping at least the second surface of the volume emitter and the frame element.

I also provide an optoelectronic lighting device comprising:

a volume emitter comprising a first surface and a second surface located opposite the first surface, wherein an active region that generates electromagnetic radiation in a first wavelength range is formed in a manner adjoining the first surface in the volume emitter, the volume emitter is at least partly transmissive to the electromagnetic radiation generated, an optically transparent frame element arranged at a side region of the volume emitter, wherein a conversion layer that converts the electromagnetic radiation into the second wavelength range is formed in the optically transparent frame element in a manner adjoining the active region, and the conversion layer is produced by a sedimentation process of phosphor particles in a flowable, curable material of the frame element, a conversion element that converts the electromagnetic radiation into a second wavelength range, the conversion element arranged on the second surface of the volume emitter, wherein the conversion element comprises an edge region projecting beyond the second surface of the radiation-generating element and formed in a manner overlapping at least the frame element, and a reflection element arranged on the frame element.

The basis of my methods and devices is forming and arranging a conversion layer within a frame element such that a light-generating, epitaxial layer may couple electromagnetic radiation directly into a conversion layer comprising a high concentration of phosphor particles of the frame element. As a result, the electromagnetic radiation is rapidly absorbed, wherein the electromagnetic radiation is converted into a second wavelength range near the volume emitter.

In this way, thermal energy flows from the conversion material of the conversion layer into the volume emitter and from there to contacting elements with which the optoelectronic lighting device is usually soldered onto a circuit board. In this way, a significant proportion of the total conversion of the electromagnetic radiation takes place at a "thermally expedient" position. By virtue of the highly concentrated conversion layer in direct proximity to the chip, the latter is not heated excessively greatly, and the carrier material of the frame element may comprise a high refractive index as a result, thereby supporting a high coupling-out of light. An improved optical efficiency and a better optical coupling-out of electromagnetic radiation are thereby made possible as a result.

In this way, a kind of "main conversion element" in the form of the conversion layer of the frame element is formed, which undertakes a large portion of the conversion performance for the electromagnetic radiation. This may realize the advantage that a conversion of optical radiation in a "secondary conversion element" is reduced. As a result, this advantageously brings about an improved thermal efficiency of the optoelectronic lighting device because thermal power may be better dissipated by virtue of a large portion of electromagnetic conversion being carried out as near to the chip as possible.

A "conversion layer" is in particular a layer configured to convert a first wavelength or a first wavelength range of the electromagnetic radiation generated by the active zone into electromagnetic radiation comprising a second wavelength or, respectively, a second wavelength range. Preferably, the conversion layer comprises a fluorescent phosphor comprising phosphor particles.

In all examples, the volume emitter LED chip comprises a conversion layer or, respectively, a conversion element. The term "optical" in this context means, in particular, that the material or, respectively, the component is at least partly, in particular completely, transmissive to the converted electromagnetic radiation.

The formulation "at least partly transmissive" comprises in particular the fact that a transmission for a wavelength of the generated or converted electromagnetic radiation is at least 70%, in particular 80%, for example, 90% in particular 95%, for example, 99%. The formulation "at least partly transmissive" comprises in particular the formulation "completely transmissive."

One example of my method provides for a polymer, in particular a silicone, in which a defined type of the phosphor particles is present, to be used as curable flowable material for the optically transparent frame element. This affords the technical advantage, in particular, that a conversion property of the conversion layer within the frame element may be defined beforehand in a simple manner. In this way, a conversion behavior of the conversion layer during operation of the optoelectronic lighting device is advantageously readily settable.

This may advantageously have the effect that expedient thermal properties may be provided for the optical electronic component, wherein thermally active conversion substances are arranged near the chip. In this way, conversion performances may be distributed between the conversion layer of the frame element and the conversion element. Different conversion properties of different phosphors may be utilized as a result.

Advantageously, before forming the frame element, the conversion element may be applied, preferably adhesively bonded, on a transparent substrate. A first type of production of the optoelectronic lighting device may be realized as a result.

The reflection element may be formed in planar fashion with two contacting elements arranged on the first surface of the volume emitter. A good reflection behavior of the converted electromagnetic radiation is supported as a result.

The frame element may be applied on a first temporary substrate.

After forming the conversion layer a second temporary substrate may be applied on the reflection element.

The conversion element may be applied on the second surface of the volume emitter, on the frame element and on the reflection element.

A second type of production of the optoelectronic lighting device is advantageously made possible by the abovementioned examples of the method.

A further example of the method provides for a frame element comprising a proportion of red phosphor particles that is predominant in a defined manner and a conversion element comprising a proportion of green phosphor particles that is predominant in a defined manner to be used. As a result, an efficient operating behavior of the optoelectronic lighting device may be provided in a simple manner, wherein the type of phosphor particles used depends on the color temperature of the emitted electromagnetic radiation.

Furthermore, what may be achieved as a result is that a radiation-technological total conversion performance is divided between the conversion element ("secondary conversion element") and the conversion layer of the frame element ("main conversion element"). An efficient thermal efficiency and coupling-out of electromagnetic radiation are advantageously supported in this way.

Owing to the fact that some types of phosphors (for example, red phosphor) generally react thermally more intensively, it is endeavored to arrange portions of such phosphors near the lighting device such that a smaller amount of such phosphor is required in the conversion element as a result. This affords the advantage that in the conversion element, which is further away from the radiation-generating element and more difficult to cool as a result, fewer critical phosphors are required. Thermal efficiency of the optoelectronic lighting device is thereby improved as a result.

This affords the technical advantage, in particular, that different conversion properties of the different phosphor particles mentioned may be utilized and an optical and/or thermal efficiency of the optoelectronic lighting device may be better dimensioned.

A further example of the method provides that a frame element comprising exclusively red phosphor particles and a conversion element comprising exclusively green phosphor particles to be used. This constitutes an improved example of dividing conversion performance between the two independent conversion elements mentioned. This affords the technical advantage, in particular, that the thermally critical red phosphor is arranged exclusively near the optoelectronic lighting device and is thereby used less critically in terms of cooling technology.

Preferably, the method provides for the volume emitter to be formed as a sapphire volume emitter flip-chip. As a result, it is possible to use efficient production methods known per se to produce a volume emitter.

Further preferably, the method is distinguished by the fact that an outer region between a radiation-emitting region of the radiation-generating element and the frame element is formed in angular fashion, preferably at an angle of approximately 45 degrees. This affords the technical advantage, in particular, that the phosphor or respectively the conversion material of the conversion layer of the frame element is arranged near the component and may be cooled efficiently as a result.

A further preferred example of the optoelectronic lighting device is characterized in that an outer region between a radiation-emitting region of the radiation-generating element and the frame element is formed in a substantially flat fashion.

This affords the technical advantage, in particular, that an improved efficiency of coupling out electromagnetic radiation may be achieved. Owing to the fact that in this way the generated electromagnetic radiation requires a longer path and scarcely penetrates the conversion layer, a reflection of electromagnetic radiation into the radiation-generating element may advantageously be eliminated to the greatest possible extent. In this way, more light power may advantageously be emitted by the optoelectronic lighting device.

A reflective material comprises a plurality of scattering particles, for example. What is advantageously brought about at such scattering particles is that the generated and/or respectively converted electromagnetic radiation may be scattered.

The scattering particles mentioned are $TiO_2$ particles, for example. By way of example, the reflective material is a mold compound or a potting compound in which the scattering particles mentioned are embedded.

By way of example, the reflective material is configured to produce a substantially white color impression. Such a reflective material may be referred to in particular as a "white reflective material" or as a "white silicone."

Advantageously, the method provides for different curable flowable materials, in particular different silicones, to be used for the conversion element and for the frame element. As a result, different properties of the materials mentioned, for example, different refractive indices may be used in a targeted manner to thus improve optical and thermal efficiency of the optoelectronic lighting device.

Further advantageously, the method provides for the conversion layer to be formed by the sedimentation process of the phosphor particles in the frame element with a proportion by volume of approximately 20% to approximately 40% of the total volume of the frame element. As a result, a high degree of concentration of phosphor particles in the conversion layer may be produced, which supports the abovementioned improved thermal and optical efficiencies of the optoelectronic lighting device.

Technical functionalities and advantages of the optoelectronic lighting device are evident analogously from corresponding technical functionalities and advantages of the method of producing an optoelectronic lighting device. This means, in particular, that technical functionalities and advantages of the device features are evident from corresponding technical functionalities and advantages of method features, and vice versa.

The described properties, features and advantages and the way in which they are achieved will become clearer and more clearly understood in association with the following description of examples explained in greater detail in association with figures, wherein the figures are not drawn in a manner true to scale. Therefore, actual size relationships may not be gathered from the figures.

Hereinafter, identical reference signs are used for identical or functionally identical features. For the sake of better clarity, it may be provided that not all figures always depict all reference signs for all elements.

The formulations "and/or respectively," "or respectively" also encompass in particular the formulation "and/or."

FIG. 1 shows a cross-sectional view of a conventional optoelectronic lighting device. The optoelectronic lighting device comprises a volume emitter 107 in the form of a sapphire substrate in which, in an epitaxial layer (e.g., indium gallium nitride, InGaN) a few μm thick, electromagnetic radiation, preferably visible blue light, is generated. It is converted into a different wavelength range by a conversion element 105 arranged on the volume emitter 107 and emitted into the surroundings. The sapphire substrate comprises a high refractive index and in this example functions as a type of coupling-out structure for the visible blue light generated in the epitaxial layer. Arranged between the epitaxial layer and two electrical contacting elements 109 is a mirror or respectively reflection layer that prevents light from being emitted downward in the direction of the contacting elements 109.

By way of example, by the conversion element 105, the blue light of the volume emitter 107 may be converted into red and green light, i.e., converted in terms of wavelength. The two contacting elements or respectively contact pads or respectively soldering pads 109 arranged at an underside of the volume emitter 107 are provided for the electrical driving of the optoelectronic lighting device. A substantially transparent frame element 111 is arranged laterally with respect to edges of the volume emitter 107 and guides light emerging laterally from the volume emitter 107 onto a reflector element 106 in the form of silicone comprising TiO2 particles ("white silicone"), which reflects the light onto the conversion element 105.

Figure 2:
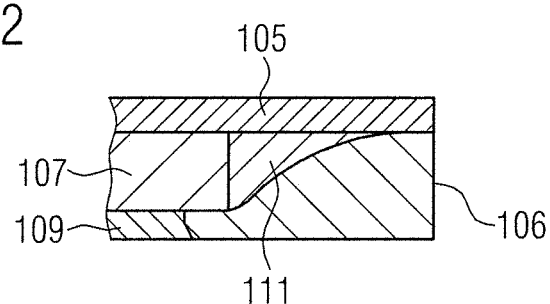
FIG. 2 shows a detail of the cross-sectional view from FIG. 1.

FIG. 2 shows an enlarged excerpt from the arrangement from FIG. 1. This reveals even better the concave or respectively meniscus-like or respectively fillet-like configuration of the frame element 111 arranged at the sidewalls of the volume emitter 107.

Figure 3:
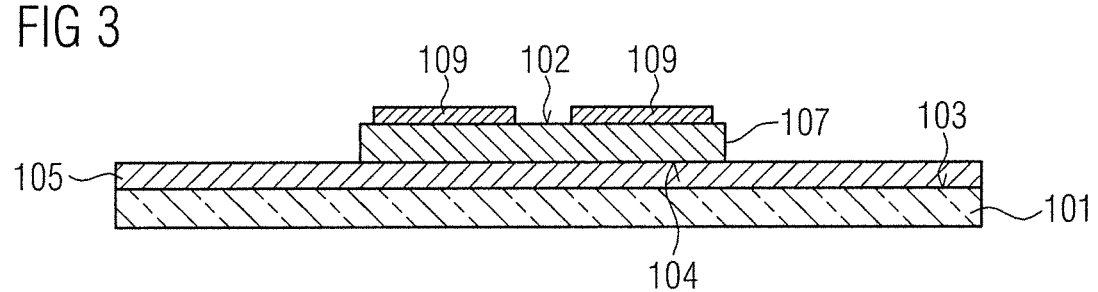
FIGS. 3 to 7 each show a successive point in time in a method of producing a first example of an optoelectronic lighting device.

FIG. 3 shows a result of a first production step in a proposed method of producing an optoelectronic lighting device. A transparent substrate 101 is discernible, on which a conversion element 105 is applied, e.g., adhesively bonded, on a surface 103. A volume emitter 107 (e.g., a sapphire substrate) is at least partly applied, e.g., adhesively bonded, on a surface of the conversion element 105. The volume emitter 107 comprises, on a first surface 102, two contacting elements 109 (e.g., soldering pads) to electrically contact the optoelectronic lighting device 100.

In this way, a so-called sapphire volume emitter flip-chip comprising an epitaxial layer (not illustrated) is realized as volume emitter 107, the flip-chip being known per se and therefore not being explained in more specific detail here. The conversion element 105 is preferably a film-like silicone layer in which the silicone has not yet fully cured and is enriched with a defined concentration of phosphor particles, in particular phosphor particles of different types, for example, red phosphor, green phosphor, a defined mixture of red and green phosphor and the like. In this way, the frame element 111 in the form of a silicone-phosphor mixture is applied laterally to the sidewalls of the volume emitter 107.

Figure 4:
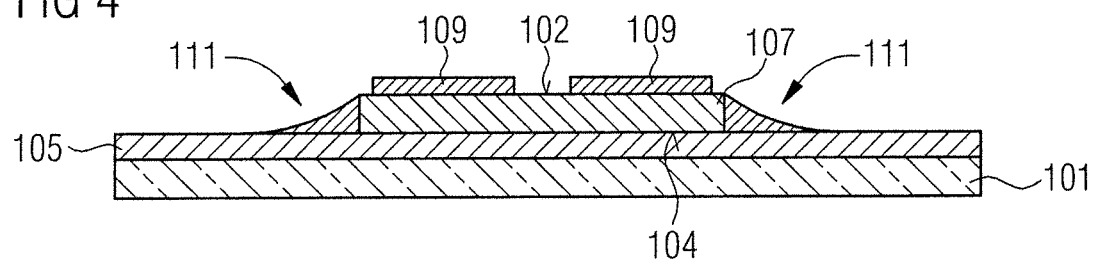

FIG. 4 shows a result of a subsequent point in time in a production method of producing the optoelectronic lighting device. It is evident that in a side or respectively corner region of the volume emitter 107 the frame element 111 comprising a curable, flowable optical material, for example, comprising silicone is formed (e.g., by dispensing), in which a defined concentration and defined types of phosphor particles are present. The specific, concave or respectively fillet-like shape of the frame element 111 results from the effects of a surface tension of the flowable silicone material of the frame element 111 and gravitation. As a result, an enclosing frame in the form of the frame element 111 is formed around the volume emitter LED chip.

Figure 5:
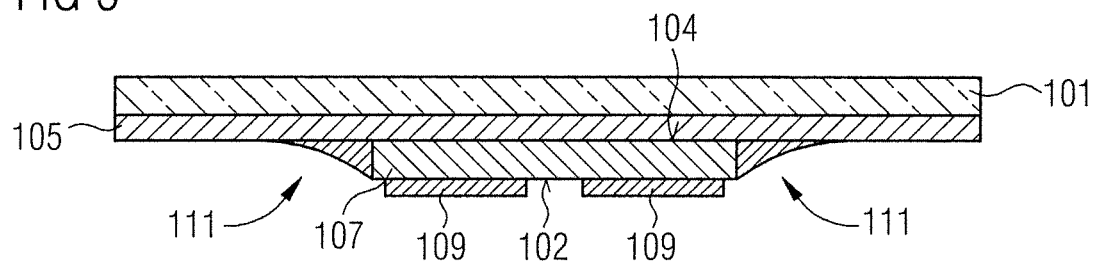

FIG. 5 shows a result of a subsequent point in time in a production method of producing the optoelectronic lighting device 100. It is evident that the entire arrangement has been rotated or respectively tilted by 180 degrees or respectively turned upside down such that the frame element 111 is directed downward as a result of which a so-called "inverse sedimentation process" for the phosphor particles within the frame element 111 is initiated by the effect of gravitation. The sedimentation process is possible by virtue of the fact that a concentration of the phosphor particles in the silicone basic material of the frame element 111 is such that the phosphor particles mentioned settle in the aqueous silicone material.

Figure 6:
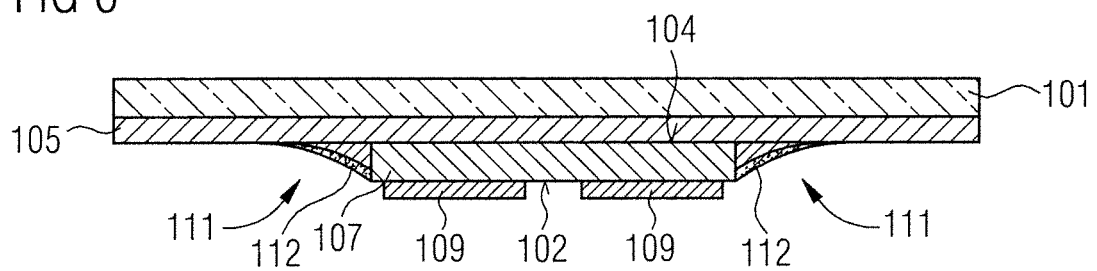

The sedimentation process mentioned is carried out for a defined time duration, preferably approximately eight hours, with the result that, as is evident in the cross-sectional view in FIG. 6, a conversion layer 112 is formed within the frame element 111, a high degree of concentration of phosphor particles being present in the conversion layer, wherein substantially clear silicone is present in the rest of the frame element 111. In this case, a ratio of a proportion by volume of the conversion layer 112 to a total volume of the frame element 111 is approximately 20% to approximately 40%. Depending on the requirement, the duration of the sedimentation process may also be longer or shorter in a defined manner.

The conversion layer 112 is formed such that it is very thin in relation to the dimensions of the frame element 111, e.g., with a thickness of a few μm, the size relationships merely being illustrated qualitatively in FIG. 6. A large portion of the frame element 111 comprises no phosphor particles as a consequence of the inverse sedimentation process.

A sedimentation process of phosphor particles may not take place at all within the conversion element 105 since a concentration of the phosphor particles present therein is so high that a concentration shift or respectively variation of the phosphor particles within the thin, film-like layer of the conversion element 105 is not possible.

A subsequent curing process involves curing the frame element 111 with the conversion layer 112 such that the entire structure subsequently may no longer deform in an undesired manner.

A filling step carried out afterward involves carrying out a process of planarizing the arrangement with white silicone which is applied on the conversion element 105, on the frame element 111 and between the contacting elements 109. In this way, a reflection element 106 is formed, comprising scattering particles at which generated or respectively converted electromagnetic radiation is reflected or respectively may be scattered. By way of example, the reflection element 106 may be formed as a white silicone with scattering particles (e.g., $TiO_2$ particles) enclosed therein.

Figure 7:
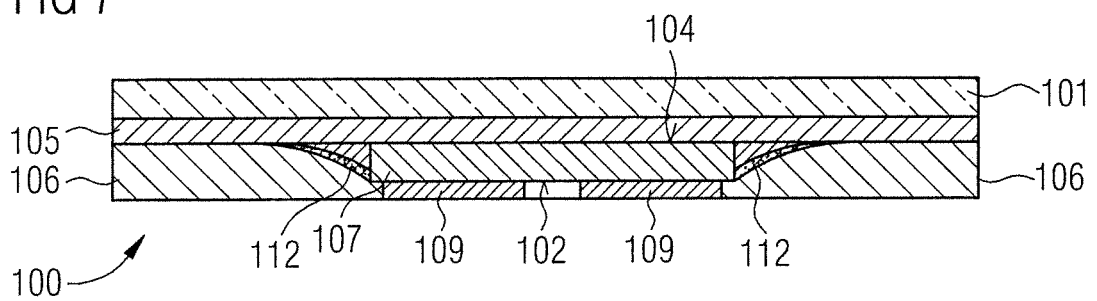
Figure 8:
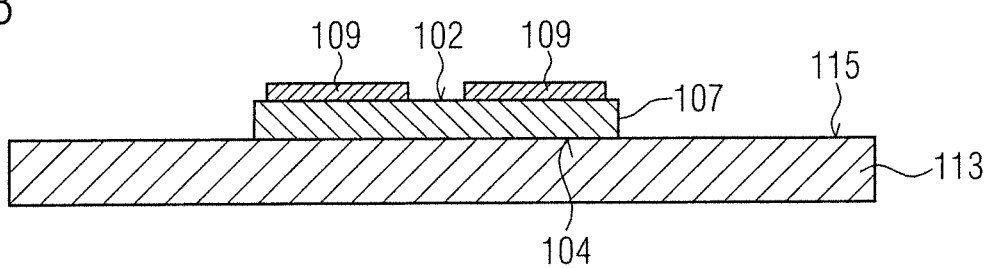
FIGS. 8 to 15 each show a successive point in time in a method of producing a second example of an optoelectronic lighting device.

In the cross-sectional view in FIG. 7, the completed first example of the optoelectronic lighting device 100 is discernible in a cross-sectional view. It is evident that the reflection element 106 is arranged on the frame element 111 with the conversion layer 112 and the conversion element 105 and between the contacting elements 109, wherein the reflection element 106 is formed such that it is substantially planar with the contacting elements 109.

In this way, generated and converted optical radiation may emerge predominantly upward through the conversion element 105 and the transparent substrate 101. Forming the reflection element 106 is followed by singulating or respectively sawing and/or stamping and/or laser sawing for the purpose of producing singulated optoelectronic components. Specific effects and advantages of the specific formation of the conversion layer 112 within the frame element 111 are explained in greater detail further below with reference to the description of FIGS. 17 to 18.

FIGS. 8 to 15 show, in a greatly simplified manner, an alternative process flow of producing a further example of an optoelectronic lighting device 200. In this example, in contrast to the process flow in FIGS. 3 to 7, first, the frame element 111 is applied on a first temporary substrate 113 and the conversion element 105 is applied on the volume emitter 107 toward the end of the process.

For this purpose, a first temporary substrate 113 is provided, the volume emitter 107 with the two contacting elements 109 being arranged on the surface 115 of the temporary substrate. The first temporary substrate 113 is not an integral part of the completed optoelectronic lighting device 200.

Figure 9:
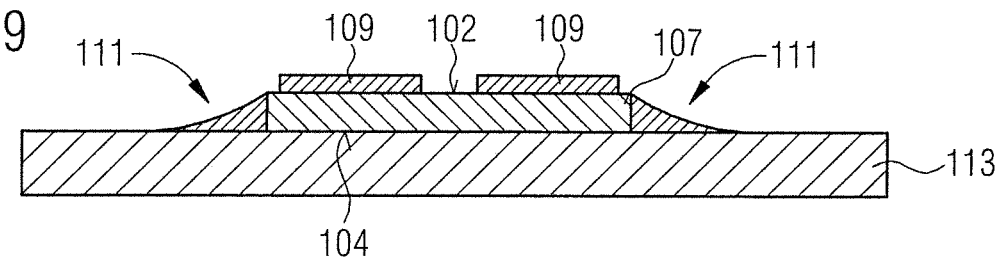

FIG. 9 shows a result of a subsequent production step of producing a second example of the optoelectronic lighting device 200. It is evident that a fillet-like or respectively meniscus-shaped or respectively concavely formed frame element 111 is applied in a corner region between the volume emitter 107 and the first temporary substrate 113, for example, by dispensing a curable, flowable silicone material containing phosphor particles.

Figure 10:
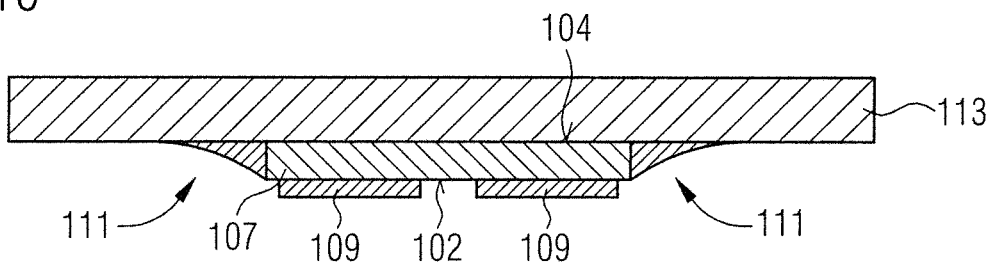

In a subsequent step in accordance with FIG. 10, it is evident that the above-explained inverse sedimentation process of the phosphor particles within the frame element 111 was initiated by tilting the entire arrangement by 180 degrees.

Figure 11:
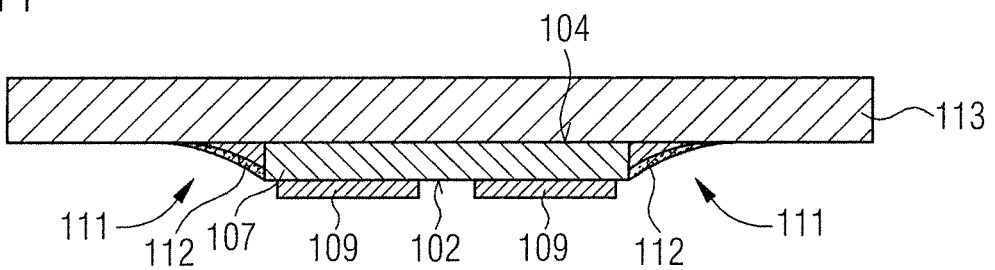

In FIG. 11, it is evident that within the frame element 111 the conversion layer 112 has formed with an increased concentration of phosphor particles, the remaining region of the frame element 111 substantially comprising clear silicone.

Figure 12:
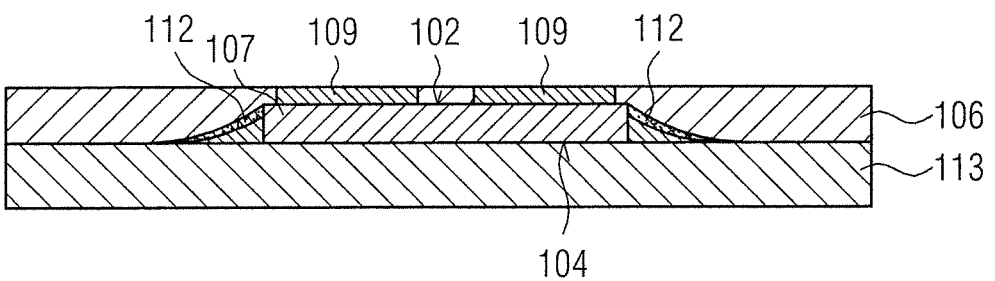

Then, in accordance with FIG. 12, the entire arrangement is once again rotated by 180 degrees and in one process step a planar reflection element 106 is applied on the first temporary substrate 113 and the frame element 111 and the contacting elements 109, which reflection element is formed such that it is substantially planar or flush with the contacting elements 109.

Afterward, a second temporary substrate 114 is applied (not illustrated in FIG. 12) on the reflection element 106. This advantageously makes it possible to mechanically support the entire arrangement with the two temporary substrates 113, 114 and thereby to counteract an undesired deformation of the entire arrangement.

Alternatively, it is also be possible first to remove the first temporary substrate 113 and then to apply the second temporary substrate 114.

Figure 13:
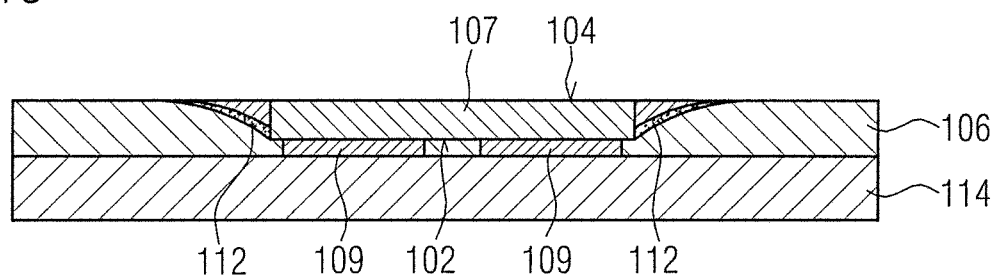

The second temporary substrate 114 applied on the reflection element 106 and the contacting elements 109 is discernible in FIG. 13. In this example, too, the reflection element 106 comprises, for example, a silicone layer with TiO$_2$ particles arranged therein.

Figure 14:
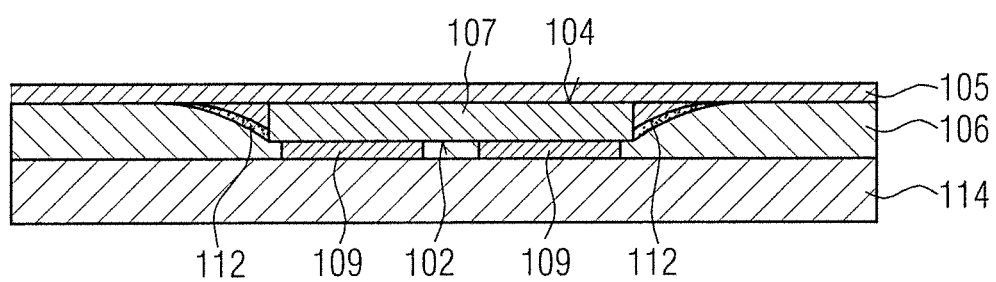

The cross-sectional view in FIG. 14 reveals that a conversion element 105 that converts the electromagnetic radiation emitted from the active region 108 of the volume emitter 107 was applied, for example, sprayed on a second surface 104 of the volume emitter 107 and on the reflection element 106. In this example, a concentration of phosphor particles in the material of the conversion element 105 is so high, or respectively a proportion of silicone in the material of the conversion element 105 is so low, that a subsequent sedimentation process of the phosphor particles in the silicone material of the conversion element 105 may not take place.

Figure 15:
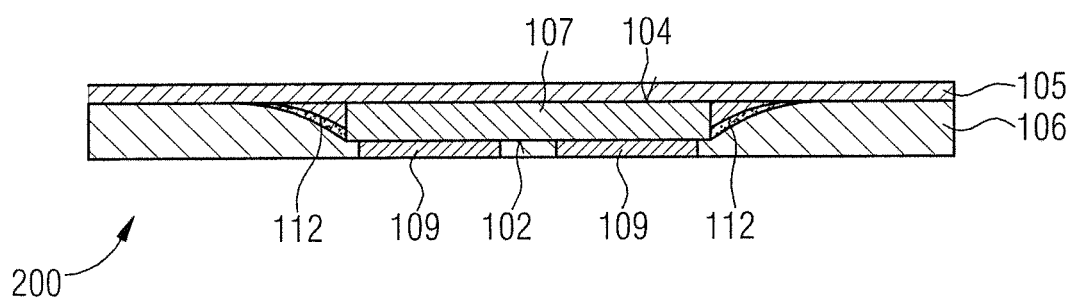

FIG. 15 reveals a cross-sectional view of the completed second example of the optoelectronic lighting device 200, which in contrast to the first example of the optoelectronic lighting device 100 from FIG. 7 comprises no substrate.

Figure 16:
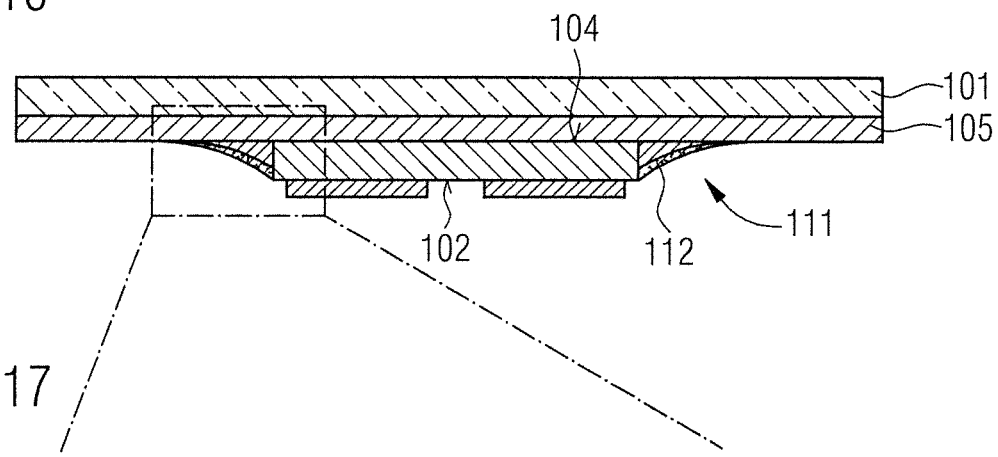
FIG. 16 shows a side view of a partial region of an optoelectronic lighting device.
Figure 17:
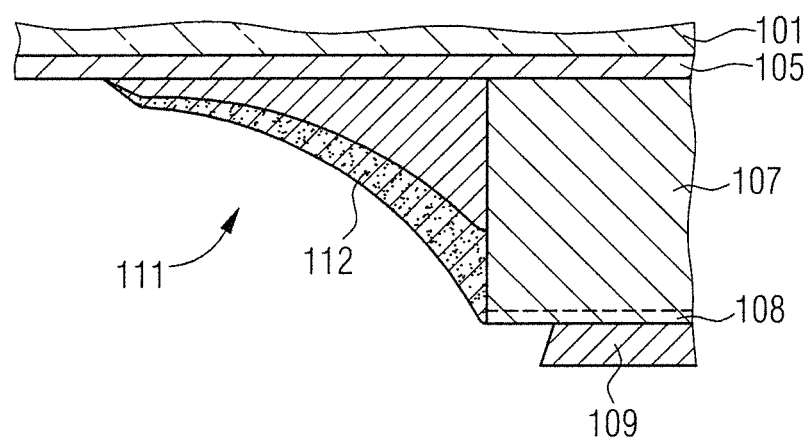
FIG. 17 shows an enlarged excerpt from FIG. 16 in accordance with a first variant.
Figure 18:
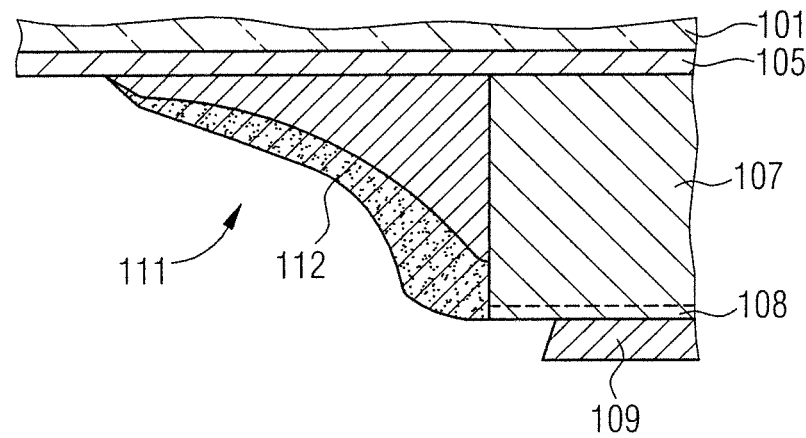
FIG. 18 shows an enlarged excerpt from FIG. 16 in accordance with a second variant.

The subsequent FIGS. 16 to 18 are intended to elucidate in greater detail a basic manner of operation and associated advantages of the proposed electronic lighting devices 100, 200. In this example, the reflection element 106 is not illustrated for the sake of better clarity.

FIG. 16 shows a cross-sectional view with an enlarged excerpt of the optoelectronic lighting device comprising the frame element 111 and the conversion layer 112 formed therein on the basis of the inverse sedimentation process explained above.

It is evident in FIG. 17 that the conversion layer 112 directly adjoins a region 108 ("epitaxial region" or respectively "active zone" or respectively "optically active region")—indicated by a dashed line—to generate electromagnetic optical radiation of the volume emitter 107, in which generation of the optical electromagnetic radiation takes place in a manner known per se. As a result, the laterally emitted electromagnetic radiation of the volume emitter 107 is advantageously coupled directly into the conversion layer 112 of the frame element 111, the conversion layer being present with a high concentration of phosphor particles, rather than, as in the conventional arrangement from FIG. 1, into the reflection element 106.

An outer region or outer transition region between the volume emitter 107 and the frame element 111 with the conversion layer 112 is formed in angular fashion, preferably at an angle of approximately 45 degrees. Red phosphor particles predominantly present within the conversion layer 112 are greatly excited and may be better cooled by the solidly and closely formed chip body of the volume emitter 107. As a result, the optically transparent, curable material of the frame element 111 is advantageously not heated to an excessively great extent. For this reason, a material (e.g., a silicone material) comprising a high refractive index may be used for the frame element 111, the material enabling a high light coupling-out of generated electromagnetic radiation. Moreover, as a result of the specific arrangement of the conversion layer 112 in relation to the active region 108 of the volume emitter 107, advantageously substantially no electromagnetic radiation (e.g., visible blue light) may be reflected back into the volume emitter 107. A luminous efficiency or respectively an efficiency of the optoelectronic lighting device may advantageously be increased as a result.

A thickness of the volume emitter 107 is preferably approximately 100 µm to approximately 300 µm, more preferably approximately 150 µm.

A width of the frame element 111 is preferably approximately 100 µm to approximately 500 µm, wherein the conversion element 105 overlaps at least the frame element 111 such that no regions remain from which radiation of the volume emitter 107 may be emitted in an unconverted manner in terms of radiation technology.

A maximum thickness of the conversion layer 112 is preferably approximately 20 µm to approximately 100 µm.

It is thus evident with reference to FIGS. 17 and 18 that a high concentration of conversion material is arranged close to the active region 108 of the volume emitter 107. This advantageously brings about a reduced loading of conversion material arranged elsewhere, for example, of conversion material in the form of the conversion element 105. An efficiency of operation of the optoelectronic lighting device may be increased in this way because an operating temperature of the conversion layer 112 of the frame element 111 may be kept low. As a result of the low thermal loading of the cured frame element 111, a longevity of the frame element 111 is supported, as a result of which a lengthening of the lifetime of the optoelectronic lighting device may advantageously be realized.

FIG. 18 shows a further variant of the frame element 111 with the conversion layer 112 in a cross-sectional view. In this example, the geometric formation of the frame element 111 is formed such that it is somewhat more greatly bulged or respectively distended or respectively bent downward. This may be achieved by using a higher degree of concentration of phosphor particles in the frame element 111 compared to the arrangement from FIG. 17, which counteracts a surface tension of the silicone in the frame element 111. This has the effect that electromagnetic radiation emerging from the active region 108 would have to cover an even further distance compared to the arrangement from FIG. 17 to penetrate through the conversion layer 112 of the frame element 111.

In this example, therefore, compared to the arrangement from FIG. 17, a path length of the already converted electromagnetic radiation until reaching the reflection element 106 (not illustrated) is significantly greater, as a result of which a probability of emitted and unconverted electromagnetic radiation being reflected back into the volume emitter 107 is advantageously low.

As a result, this supports an even better coupling of electromagnetic radiation into the conversion layer 112 and less undesired feedback of electromagnetic radiation into the volume emitter 107.

The bulging may have an unfavorable influence on the lifetime of the optoelectronic lighting device only if the bulging is so large that the conversion layer temperature is higher than elsewhere in the lighting device.

The different geometric shapes of the frame element 111 as illustrated in FIGS. 17 and 18 may be achieved in particular by a different quantity and/or different types of phosphor particles within the frame element 111 that comprise in particular different relative densities. On account of the defined sedimentation duration mentioned above, different geometric shapes of the frame element 111 may be formed.

Preferably, predominantly red phosphor particles may be arranged in the conversion layer 112 such that a large portion of radiation conversion takes place here. Alternatively, the same type of phosphor particles as for the conversion element 105 may be used for the conversion layer 112.

Alternatively, a plurality of different types of phosphor particles (e.g., green phosphor particles, red phosphor particles, mixtures of green and red phosphor particles comprising a defined mixing ratio) may be arranged in the conversion layer 112, wherein at least one of the phosphors mentioned is not present in the conversion element 105.

In accordance with the materials specifically used, it is thus advantageously possible to generate desired wavelengths of the electromagnetic radiation and thus a color temperature of the optoelectronic lighting device. The differently positioned different types of phosphor particles make it possible as a result for excitation energies to be distributed within the chip such that a better cooling of the phosphor or respectively of the phosphors of the conversion layer 112 takes place.

Preferably, a mixing ratio of the phosphor particles in the conversion layers 105, 112 may be determined in an experimentally based manner such that a suitable division of the phosphor particles mentioned between the two conversion layers 105, 112 may be carried out. As a result, what is crucial in this example is what color temperature the electromagnetic radiation emitted by the optoelectronic lighting device is intended to comprise.

By way of example, phosphors may be arranged in an inversely proportional ratio in the conversion element 105 and in the conversion layer 112, and vice versa.

Figure 19:
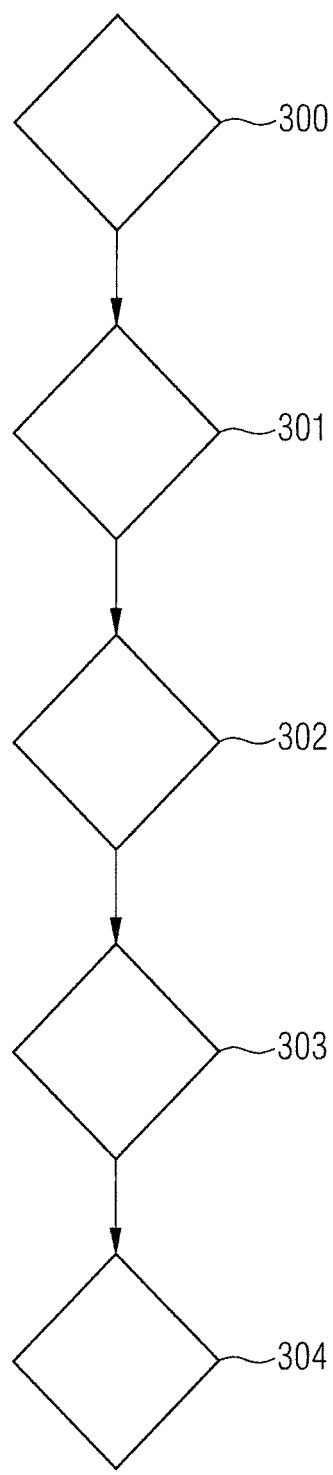
FIG. 19 shows a flow diagram of a method of producing an optoelectronic lighting device.

FIG. 19 shows a sequence of producing an optoelectronic lighting device in a greatly simplified manner.

A step 300 involves forming a volume emitter 107 comprising a first surface 102 and a second surface 104 located opposite the first surface 102, wherein an active region 108 that generates electromagnetic radiation in a first wavelength range is formed in the volume emitter 107 in a manner adjoining the first surface 102, and wherein the volume emitter 107 is formed such that it is at least partly transmissive to the electromagnetic radiation generated.

A step 301 involves forming a concavely formed, optically transparent frame element 111 comprising a curable, flowable material comprising phosphor particles at a side region of the volume emitter 107, wherein forming a conversion layer 112 that converts the electromagnetic radiation into a second wavelength range is carried out by a sedimentation process of the phosphor particles, wherein the conversion layer 112 is formed within the optically transparent frame element 111 in a manner adjoining the optically active region 108.

A step 302 involves forming a reflection element 106 on the optically transparent frame element.

A step 303 involves forming a conversion element 105 that converts the electromagnetic radiation into the second wavelength range, wherein the conversion element 105 is formed in a manner overlapping at least the second surface 104 of the volume emitter 107 and the frame element 111.

To summarize, I provide an efficient technical concept that may efficiently increase a coupling-out of electromagnetic radiation from a volume emitter LED chip. This is implemented primarily by providing at side faces of the volume emitter LED chip a frame element comprising an optical material in which a highly concentrated conversion layer is formed, which is arranged in a manner adjoining a radiation-generating region of the volume emitter LED chip. Light coupled out from the active region of the volume emitter LED chip is predominantly coupled into the highly concentrated conversion layer of the frame element in this way, is converted into a second wavelength range in the process and may subsequently be reflected at the reflection element.

Although my devices and methods have been more specifically illustrated and described in detail by preferred examples, nevertheless this disclosure is not restricted by the examples disclosed and other variations may be derived therefrom by those skilled in the art, without departing from the scope of protection of the appended claims.

This application claims priority of DE 10 2016 112 275.0, the subject matter of which is incorporated herein by reference.

The invention claimed is:

1. A method of producing an optoelectronic lighting device comprising:

forming a volume emitter comprising a first surface and a second surface located opposite the first surface, wherein an active region that generates electromagnetic radiation in a first wavelength range is formed in the volume emitter in a manner adjoining the first surface, and the volume emitter is formed such that it is at least partly transmissive to the electromagnetic radiation generated, forming a conversion element that converts the electromagnetic radiation into the second wavelength range, wherein the conversion element is formed at the second surface of the volume emitter, the conversion element is formed in a manner overlapping with an edge region the second surface of the volume emitter, and the edge region extends laterally side regions of the volume emitter, after forming the conversion element on the second surface of the volume emitter in a separate step, a concavely formed, optically transparent frame element comprising a curable, flowable material comprising phosphor particles is formed at the side regions of the volume emitter and at the edge region of the conversion element, wherein the frame element encloses the volume emitter, wherein forming a conversion layer that converts the electromagnetic radiation into a second wavelength range is carried out by a sedimentation process of the phosphor particles, and the conversion layer is formed within the optically transparent frame element in a manner adjoining at the concavely formed side of the frame element and adjoining at the optically active region of the volume emitter, and forming a reflection element on the frame element.

2. The method according to claim 1, wherein, before forming the frame element, the conversion element is applied or adhesively bonded on a transparent substrate.

3. The method according to claim 1, wherein the reflection element is formed in planar fashion with two contacting elements arranged on the first surface of the volume emitter.

4. The method according to claim 1, wherein the frame element is applied on a first temporary substrate after forming the conversion layer, a second temporary substrate is applied on the reflection element and the conversion element is applied on the second surface of the volume emitter, the frame element and the reflection element.

5. The method according to claim 1, wherein the frame element comprising a proportion of red phosphor particles that is predominant in a defined manner and a conversion element comprising a proportion of green phosphor particles that is predominant in a defined manner are used.

6. The method according to claim 5, wherein the frame element comprising red phosphor particles and the conversion element comprising green phosphor particles are used.

7. The method according to claim 1, wherein different curable flowable materials or different silicones are used for the conversion element and the frame element.

8. The method according to claim 1, wherein the conversion layer is formed by the sedimentation process of the phosphor particles in the frame element with a proportion by volume of approximately 20% to approximately 40% of the total volume of the frame element.

9. The method according to claim 1, wherein the optically transparent frame element is formed in a ring shape at the side regions of the volume emitter enclosing the volume emitter.

10. The method according to claim 1, wherein forming the conversion layer carried out by the sedimentation process of the phosphor particles is performed after forming the transparent frame element.

11. The method according to claim 1, wherein the optically transparent frame element is only formed at the side regions of the volume emitter, and forming the conversion layer carried out by the sedimentation process of the phosphor particles is performed after the forming of the transparent frame element.

12. An optoelectronic lighting device comprising:
a volume emitter comprising a first surface and a second surface located opposite the first surface, wherein an active region that generates electromagnetic radiation in a first wavelength range is formed in a manner adjoining the first surface in the volume emitter, and the volume emitter is at least partly transmissive to the electromagnetic radiation generated, a conversion element that converts the electromagnetic radiation into a second wavelength range, said conversion element being arranged on the second surface of the volume emitter, wherein the conversion element comprises an edge region projecting beyond the second surface of the radiation-generating element, an optically transparent frame element arranged at the side regions of the volume emitter and at the edge region of the conversion element, the frame element is an element separate from the conversion element, the frame element encloses the volume emitter, a conversion layer that converts the electromagnetic radiation into the second wavelength range is formed in the optically transparent frame element in a manner adjoining the concavely formed side of the frame element and at the active region of the volume emitter, and the conversion layer is produced by a sedimentation process of phosphor particles in a flowable, curable material of the frame element, the conversion element laterally overlap the frame element, and a reflection element arranged on the frame element.

13. The optoelectronic lighting device according to claim 12, wherein the optically transparent frame element has a ring shape and is formed at the side regions of the volume emitter surrounding the volume emitter.

14. A method of producing an optoelectronic lighting device comprising:
forming a volume emitter comprising a first surface and a second surface located opposite the first surface, wherein an active region that generates electromagnetic radiation in a first wavelength range is formed in the volume emitter in a manner adjoining the first surface, the volume emitter is formed such that it is at least partly transmissive to the electromagnetic radiation generated, forming a first temporary substrate at the second surface of the volume emitter, wherein the first temporary substrate is formed in a manner overlapping with an edge region the second surface of the volume emitter, and the edge region of the first temporary substrate extends laterally the side regions of the volume emitter, forming a concavely formed, optically transparent frame element comprising a curable, flowable material comprising phosphor particles at the side region of the volume emitter and at the edge region of the first temporary substrate, wherein the frame element encloses the volume emitter, forming a conversion layer that converts the electromagnetic radiation into a second wavelength range is carried out by a sedimentation process of the phosphor particles, and the conversion layer is formed within the optically transparent frame element in a manner adjoining at the concavely formed side of the frame element and at the optically active region of the volume emitter, removing the first temporary substrate, forming a conversion element that converts the electromagnetic radiation into the second wavelength range, wherein the conversion element is formed at the second surface of the volume emitter, the conversion element is formed in a manner overlapping the second surface of the volume emitter, and an edge region the conversion element extends laterally the side regions of the volume emitter and covers the frame element, and forming a reflection element on the frame element.

15. The method of claim 1, wherein the arrangement is rotated such that as a result of which an sedimentation process for the phosphor particles within the frame element is initiated by the effect of gravitation, wherein the phosphor particles aggregate at the concavely formed outer surface of the frame element.

16. The method of claim 14, wherein the arrangement is rotated such that as a result of which an sedimentation process for the phosphor particles within the frame element is initiated by the effect of gravitation, and the phosphor particles aggregate at the concavely formed outer surface of the frame element.

17. The method of claim 1, wherein the conversion element is directly formed on the second surface of the volume emitter.

18. The optoelectronic lighting device according to claim 12, wherein the frame element comprises different red phosphor particles and the conversion element comprises green phosphor particles.

19. The optoelectronic lighting device according to claim 12, wherein the conversion element and the frame element comprise different curable flowable materials.

20. The optoelectronic lighting device according to claim 12, wherein a plurality of different types of phosphor particles are arranged in the conversion layer of the frame element, and at least one kind of phosphor is not present in the conversion element.

* * * * *